US012812833B2

(12) United States Patent
Khoshnood et al.

(10) Patent No.: US 12,812,833 B2
(45) Date of Patent: Nov. 24, 2026

(54) FEEDER CART MANAGEMENT SYSTEM

(71) Applicant: INOVAXE CORPORATION, Boca Raton, FL (US)

(72) Inventors: Bahman Khoshnood, Boca Raton, FL (US); Brandon Nolan, Boca Raton, FL (US); Angelo Panagopoulos, Boca Raton, FL (US); David Ocasio, Orange Park, FL (US)

(73) Assignee: INOVAXE CORPORATION, Boca Raton, FL (US)

( * ) Notice: Subject to any disclaimer, the term of this patent is extended or adjusted under 35 U.S.C. 154(b) by 0 days.

(21) Appl. No.: 19/173,560

(22) Filed: Apr. 8, 2025

(65) Prior Publication Data

US 2025/0318097 A1 Oct. 9, 2025

Related U.S. Application Data

(60) Provisional application No. 63/631,307, filed on Apr. 8, 2024.

(51) Int. Cl.

| | |
|---|---|
| ***H05K 13/08*** | (2006.01) |
| ***H05K 5/00*** | (2025.01) |
| ***H05K 13/04*** | (2006.01) |

(52) U.S. Cl.

CPC ....... *H05K 13/0882* (2018.08); *H05K 5/0018* (2022.08); *H05K 13/0419* (2018.08); *H05K 13/087* (2018.08)

(58) Field of Classification Search

CPC ............. H05K 5/0018; H05K 13/0419; H05K 13/0417; H05K 13/087; H05K 13/0882; H05K 5/0017; H05K 13/081; H05K 13/0812; H05K 13/0813; H05K 13/0815; H05K 13/0817; H05K 13/0818

See application file for complete search history.

(56) References Cited

U.S. PATENT DOCUMENTS

2003/0110610 A1* 6/2003 Duquette ............. H04N 13/239 348/E13.005
2017/0027091 A1* 1/2017 Jakobsson .......... H05K 13/0417
2020/0344926 A1* 10/2020 Higashino .......... H05K 13/0417
2020/0401133 A1* 12/2020 Armbrust ............... B62D 63/02

* cited by examiner

*Primary Examiner* — Deeprose Subedi
(74) *Attorney, Agent, or Firm* — Malloy & Malloy, P.L.; Robert M. Downey

(57) ABSTRACT

A system for communicating with and monitoring feeder carts in an SMT production facility includes a module with a built-in touchscreen display for providing real-time information on the line, machine, table, product setup, and part numbers associated with each cart. The module further incorporates multiple LED assemblies for enhanced visibility, a built-in scanner enabling hands-free SMT reel scanning, and an external rechargeable battery to ensure prolonged power supply. A Wi-Fi enabled microprocessor facilitates communication with a computer running system software via wired or wireless protocols.

3 Claims, 9 Drawing Sheets

FEEDER CART MANAGEMENT SYSTEM

This non-provisional patent application is based on provisional patent application Ser. No. 63/631,307 filed on Apr. 8, 2024.

BACKGROUND OF THE INVENTION

Field of the Invention

The present invention relates to a system, including hardware components, for managing feeder carts and their respective feeders and parts within surface mount technology (SMT) production facilities.

Description of the Related Art

As used below, throughout the background and specification of the invention, the following items, equipment, phrases and components have the following definitions:

Parts: refers to the various electronic components that are mounted onto printed circuit boards (PCBs) using automated assembly processes. These parts can include a wide range of surface-mount devices (SMDs) that serve different electrical functions within a circuit. Examples include, but are not limited to resistors, capacitors, microprocessors, diodes, etc.

Feeders: devices used to supply and present surface-mount components to pick-and-place machines during PCB assembly. Feeders hold and advance components in a controlled manner, ensuring precise and efficient placement onto printed circuit boards (PCBs).

Feeder Carts: mobile storage and transport units designed to hold and organize component feeders used in pick-and-place machines. These carts facilitate efficient feeder management, allowing for quick feeder swaps, offline setup, and streamlined production processes.

Setup: the process of preparing a feeder cart with the necessary component feeders and configurations before it is used in production. Proper setup ensures that the correct parts are available and positioned for seamless integration with pick-and-place machines, minimizing downtime and errors during PCB assembly.

Product Setup: the process of configuring a production line, including feeder carts, pick-and-place machines, and other equipment, to assemble a specific PCB design. Proper product setup ensures that the correct components, feeders, and machine parameters are in place for efficient and accurate manufacturing.

Family Setup: the process of configuring a production line to accommodate multiple PCB designs that share common components and feeder arrangements. This approach optimizes efficiency by reducing the number of feeder changeovers required between different products within the same family.

Setup Sheet: a document that provides detailed instructions for configuring a feeder cart, pick-and-place machine, and other production equipment for a specific product or family setup. It serves as a reference for production personnel to ensure that the correct components, feeders, and machine settings are used during assembly.

Pick-and-Place Machine: a critical piece of equipment used to automatically place surface-mount components onto a printed circuit board (PCB). The machine uses a combination of robotic arms, vision systems, and precision feeders to pick up components from a feeder and place them accurately onto the PCB according to the design file.

Feeder Table: a dedicated workstation or platform used to organize and support component feeders that supply parts to pick-and-place machines. It is designed to provide easy access to feeders for setup, loading, maintenance, and storage, ensuring an efficient flow of components throughout the production process.

Product: the finished or partially assembled printed circuit boards (PCBs) that are being manufactured or assembled using SMT techniques. These products can vary widely in terms of design, function, and complexity, depending on the end application, ranging from consumer electronics to industrial equipment and automotive systems.

Line, Machine, Table, and Setup Information: the critical data and configurations that define the production process for a given product. This information ensures that the proper equipment, settings, and components are in place for successful PCB assembly.

In Surface Mount Technology (SMT) assembly facilities, feeder carts play a critical role in organizing and transporting component feeders for pick-and-place machines. These carts must be connected to a power source to enable communication with the production system. Typically, power is supplied either by plugging the feeder cart into a pick-and-place machine or an offline feeder station.

When a feeder cart is stored offline, it may be awaiting teardown, or a new setup based on production schedules. During this time, the cart is not connected to a power source. To identify the product or family setup associated with each cart, production personnel use printed setup sheets, which provide the necessary information for organizing and managing the feeder carts within the production environment.

SMT assembly facilities often face several challenges in managing, scheduling, setting up, and running production associated with feeder carts and their associated feeders and parts, including but not limited to:

a) Locating feeder carts set up with a specific product or family setup;
b) Identifying which carts are setup for a particular line, machine, or table;
c) Misidentifying feeder carts due to a misplaced or lost setup sheet or incorrect placement of such sheet;
d) Inability to identify feeder carts with specific parts mounted to them;
e) Lack of guidance on where to mount parts on the feeder carts during the setup process;
f) Difficulty in determining common parts between old and new setups during the changeover process;
g) Accidental misplacement of feeders;
h) Errors in removing or mounting parts on feeders;
i) Time-consuming verification of feeder setups; and
j) Potential production downtime resulting from the aforementioned problems, impacting Overall Equipment Effectiveness (OEE).

SUMMARY OF THE INVENTION

The present invention provides a system for managing feeder carts in an SMT production facility. The system of the present invention includes a hardware module that includes a built-in, touchscreen, display providing information related to the line, machine, table, product setup, and part numbers. Multiple LED and light pipe assemblies on the module provide for enhanced visibility. The module further includes a built-in barcode scanner for hands-free operation when scanning SMT reels. Further, an external, rechargeable battery ensures prolonged power supply, even when not connected to an external power source. Finally, a Wi-Fi enabled microprocessor board facilitates communication with a computer that runs software via wired or wireless protocols.

The proposed system, coupled with the invention's Software System, addresses the challenges and offers the following functionalities:

a) Utilization of Bluetooth technology for reporting the physical location of the feeder cart.
b) Integration with an automated UI for selecting Line, Machine, Table, Setup, or part numbers, with LED assemblies illuminating applicable feeder carts accordingly.
c) Displaying Line, Machine, Table, and Setup information on the built-in display.
d) Guiding users during setup by indicating part mounting locations via the built-in display, eliminating the need for additional handheld devices or proximity to a PC.
e) Depicting, via the built-in display, proper part information, such as orientation.

In summary, the Feeder Cart Management System of the present invention provides an innovative solution to the challenges encountered in managing feeder carts and their respective feeders and parts within SMT production environments, offering improved efficiency, accuracy, and ease of operation.

BRIEF DESCRIPTION OF THE DRAWINGS

For a fuller understanding of the nature of the present invention, reference should be had to the following detailed description taken in connection with the accompanying drawings in which.

Like reference numerals refer to like parts throughout the several views of the drawings.

DETAILED DESCRIPTION OF THE PREFERRED EMBODIMENT

Figure 1:
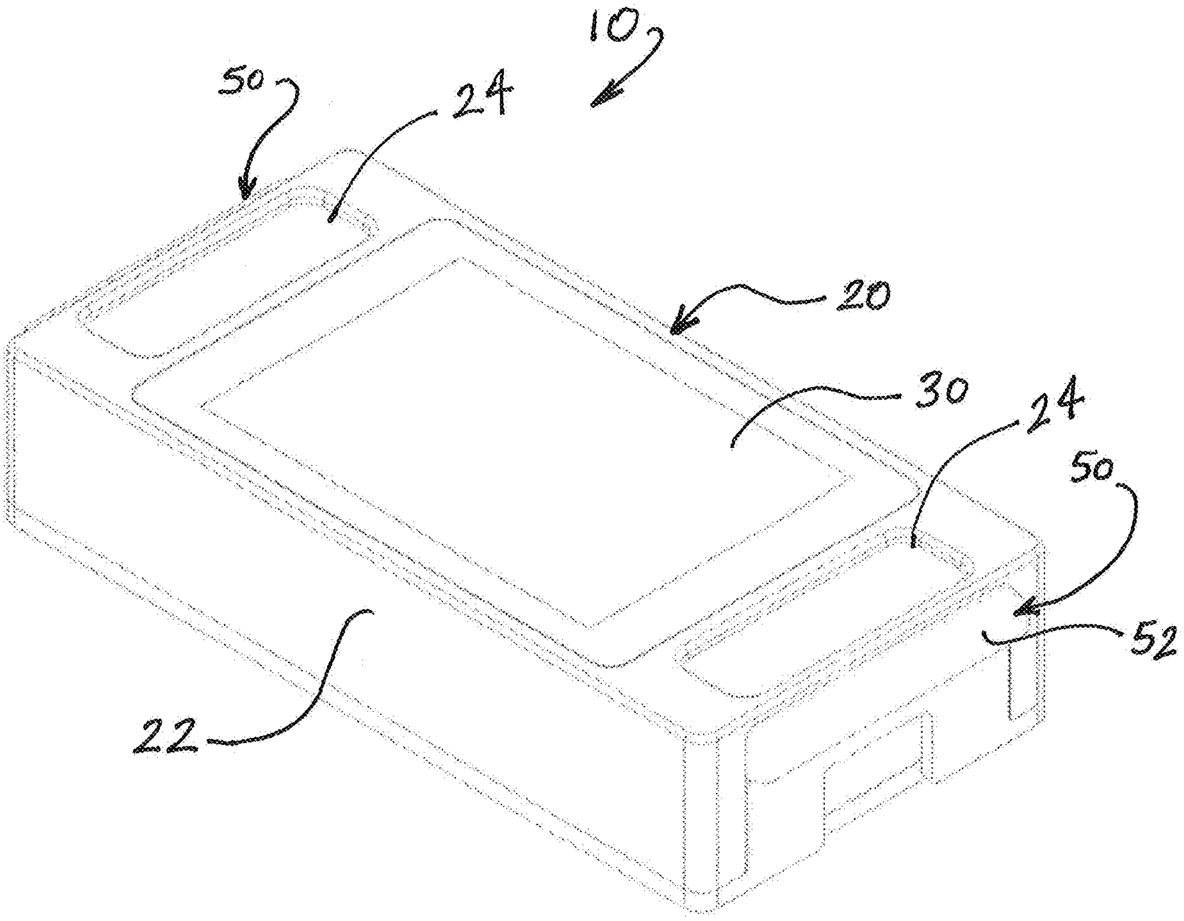
FIG. 1 is a top perspective view of a hardware module of the system for managing feeder carts according to the present invention.
Figure 2:
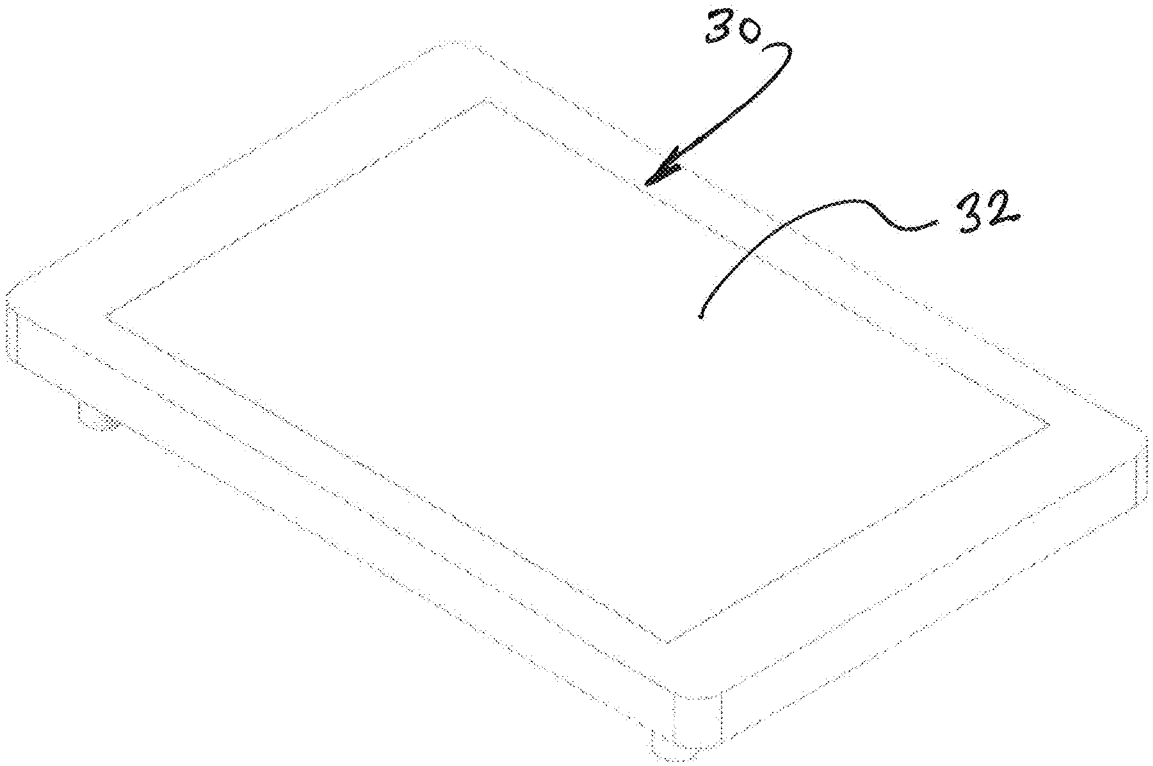
FIG. 2 is an isolated perspective view of a display shown removed from the hardware module of FIG. 1.
Figure 3:
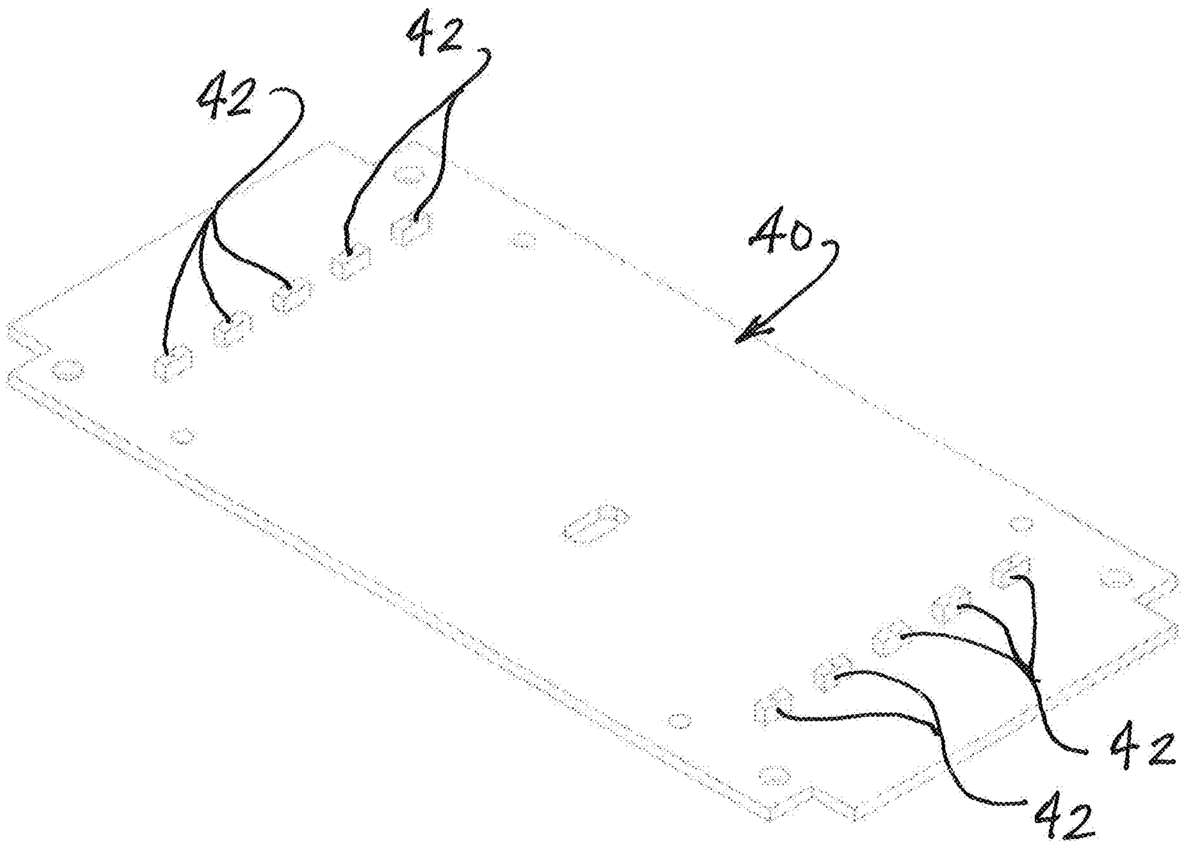
FIG. 3 is an isolated top perspective view of a printed circuit board assembly with LED banks used in the hardware module of FIG. 1.
Figure 4:
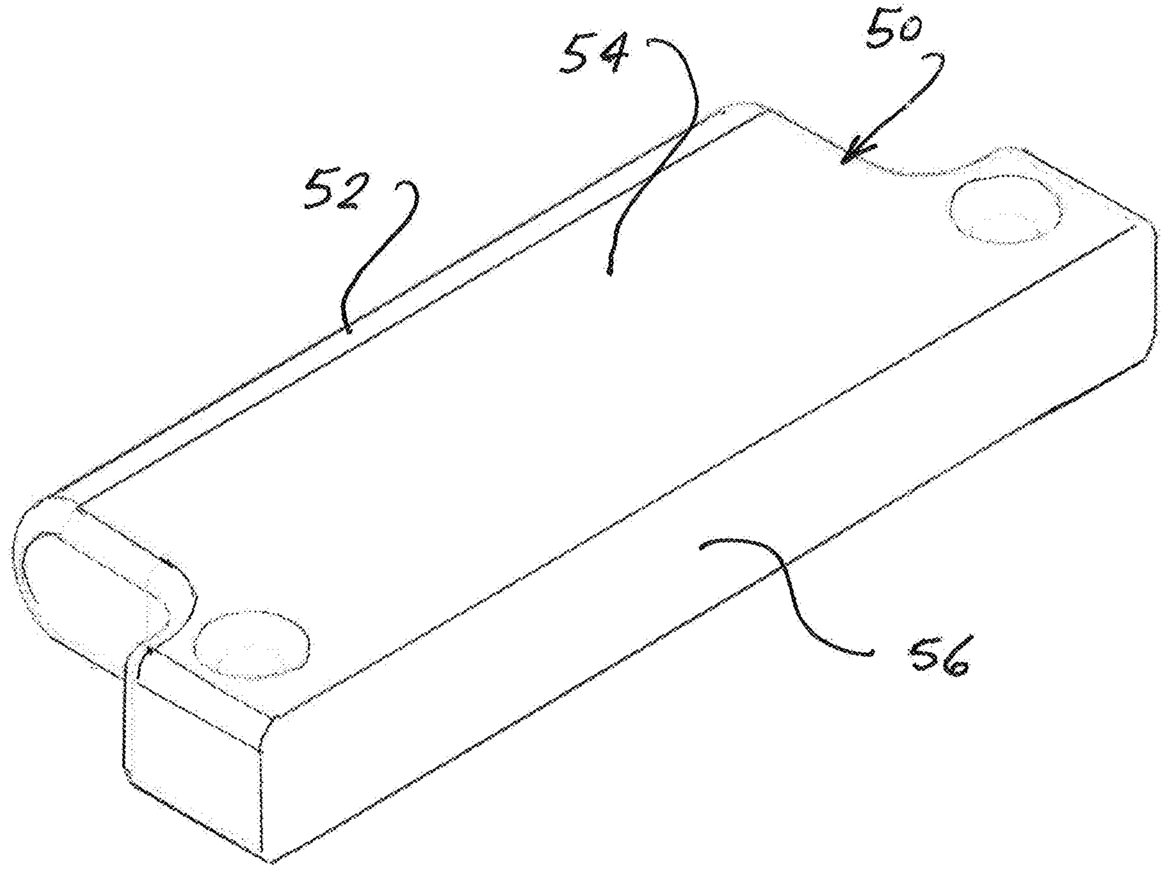
FIG. 4 is an isolated perspective view of acrylic light pipes used in the hardware module of FIG. 1.
Figure 8:
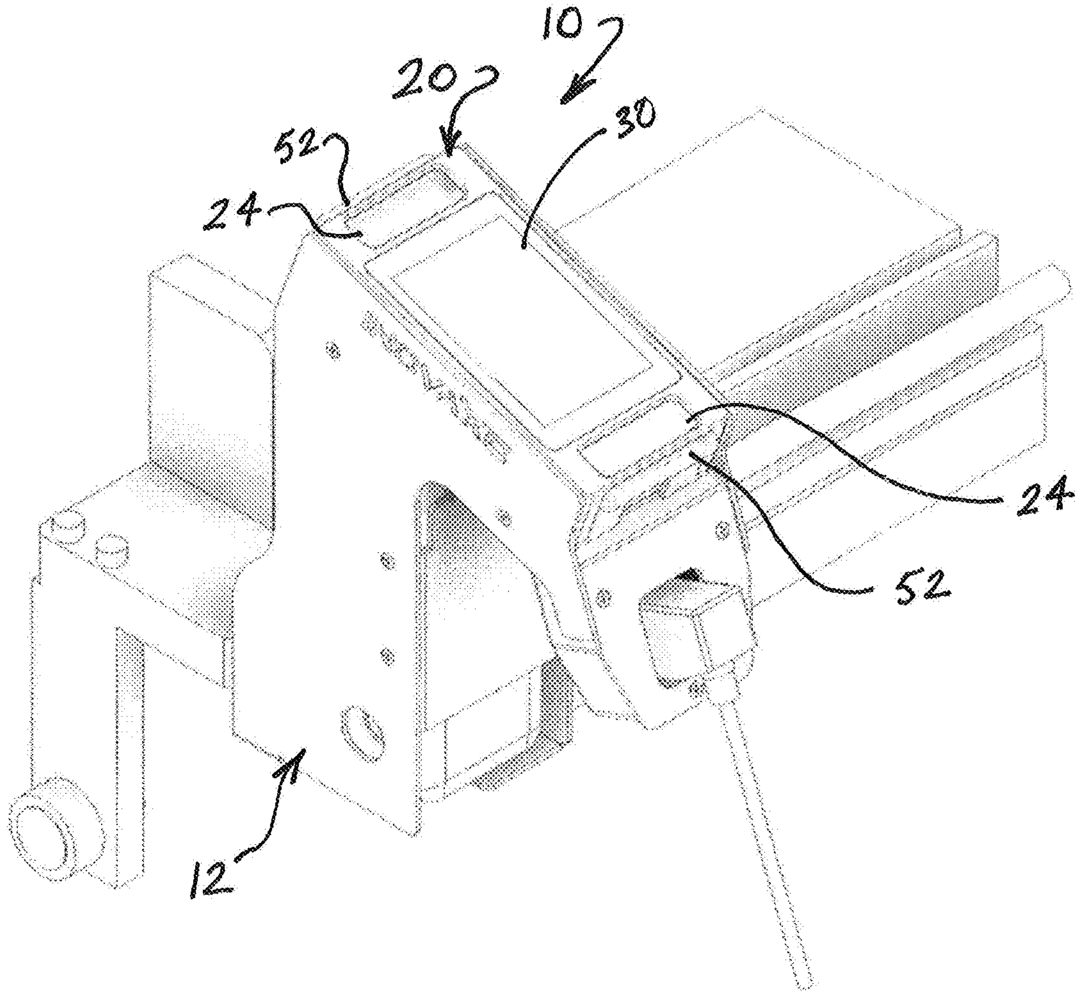
FIG. 8 is a perspective view showing the hardware module of FIG. 1 mounted within a feeder cart.
Figure 9:
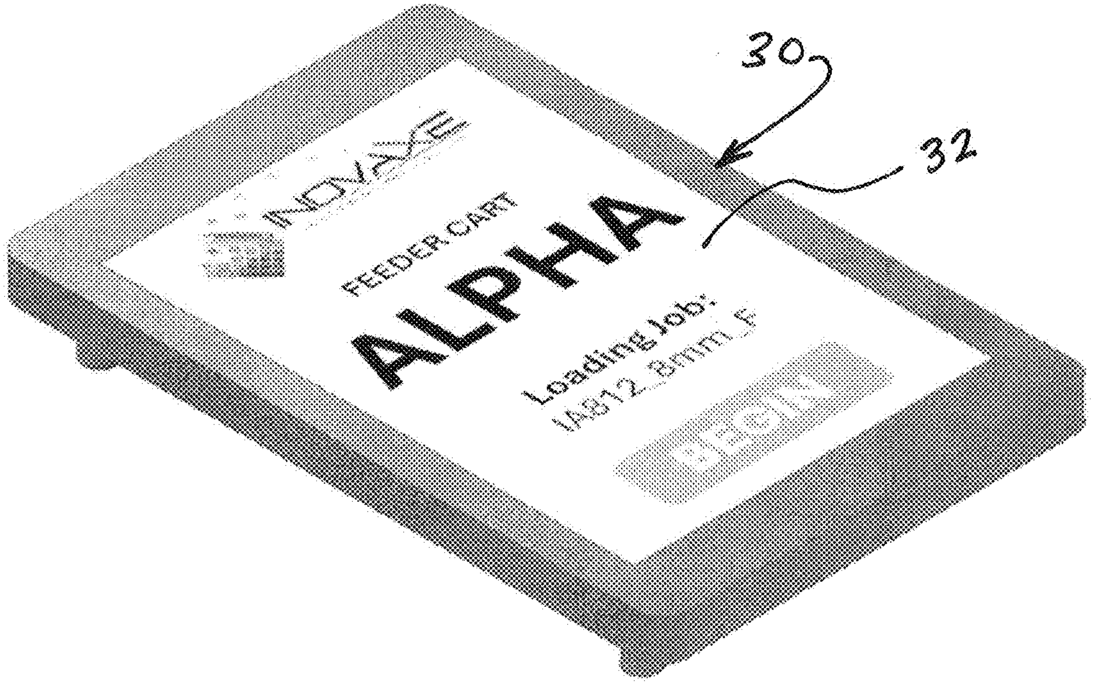
FIG. 9 is a top perspective view of the display screen of the hardware module.

Referring to the several views of the drawings, and initially FIGS. 1 and 8, the feeder cart management system of the present invention is shown and is generally indicated as 10. The feeder cart management system 10 includes a hardware module 20 that contains a number of electronic components within the module housing 22. In particular, the components of the module 20 include a built-in touchscreen display that is positioned on the top side of the housing as seen in FIGS. 1 and 8. Referring to FIG. 2, the touchscreen display 30 includes a frame surrounding a display screen 32. The module 20 further includes a printed circuit board 40 within the interior of the module 20. The printed circuit board 40 includes a plurality of LEDs 42. As seen in FIG. 3, there is a linear arrangement of LEDs 42 at each end of the printed circuit board, at the top side at each end of the printed circuit board 40. The module 20 further includes two light pipes 50 at both the top end and bottom end of the module housing. As seen in FIG. 4, each light pipe 50 includes a rounded end 52 that has a generally bullnose shape, a top side 54 and an inner facing flat side 56. The light pipes 50 are supported on top of the printed circuit board, at each end, so that the linear arrangement of LEDs shines through the flat end 56 to essentially illuminate the entire light pipe 50 at each end of the module. As seen in FIG. 1, the light pipe is exposed at both the bottom end and the top end, as well as through windows 24 on a top side of the module. More particularly, the bulbous or rounded end 52 of the light pipe protrudes at the bottom end of the housing 22, as well as at the top end of the housing 22. The windows 24 are aligned with the top sides 54 of the light pipes for transmitting light therefrom. The LEDs and light pipe assemblies on the module provide for enhanced visibility so that a feeder cart 12 (see FIG. 8) can be located from a distance. Illumination of the LED and light pipe assemblies assists with locating the feeder cart 12 in the facility.

Figure 5:
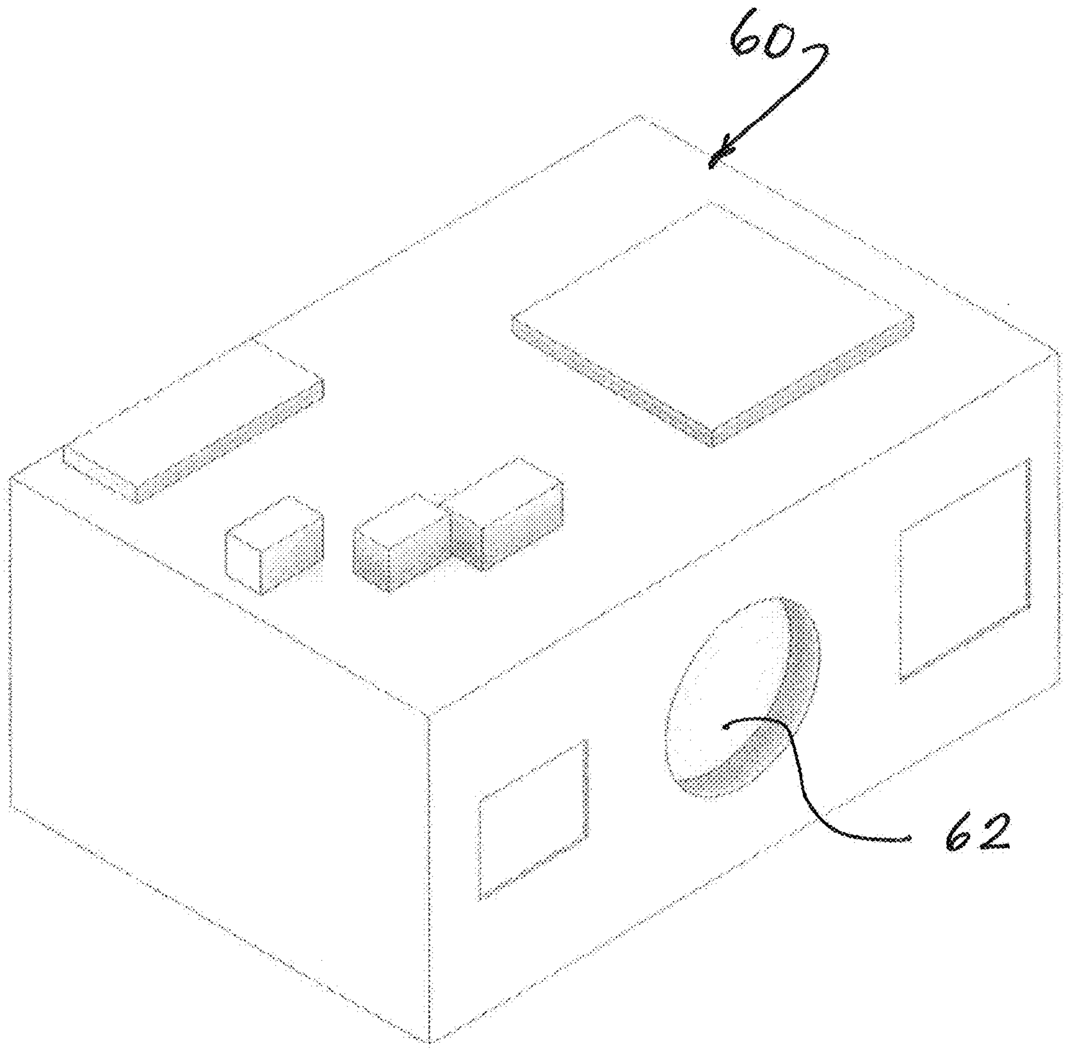
FIG. 5 is a top perspective view of a barcode scanner of the present invention.

Referring to FIG. 5, the module 20 further includes a built-in barcode scanner 60 that includes an optical scanner 62 for reading barcode labels on SMT reels.

Figure 6:
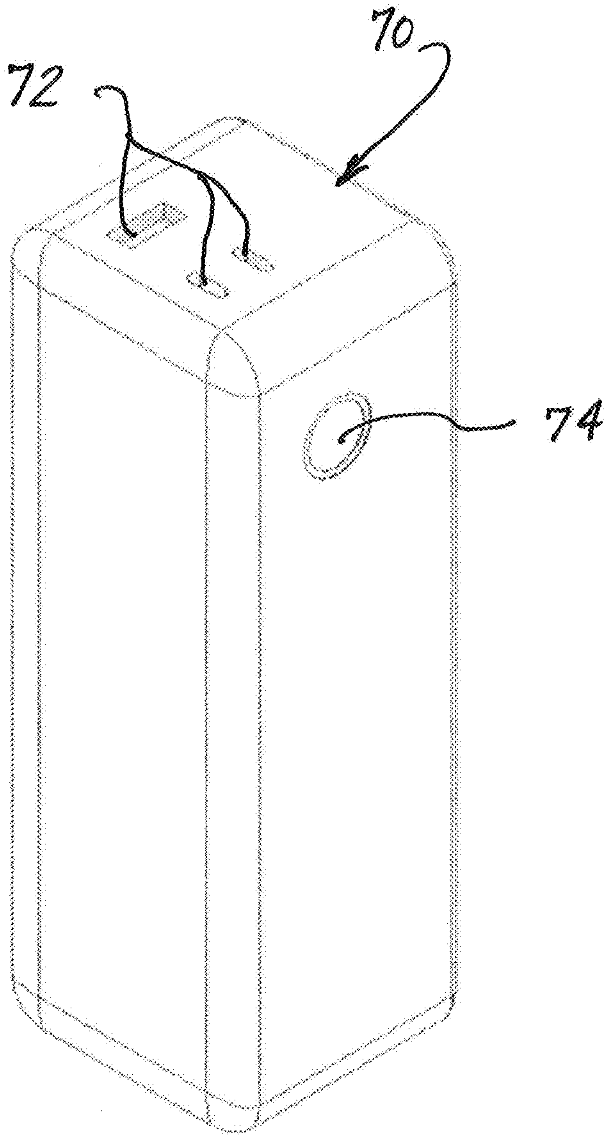
FIG. 6 is a top perspective view of a battery for powering the hardware module of FIG. 1.

FIG. 6 illustrates an external battery power source 70 that allows for a prolonged power supply to the module 20 and its components when not connected to an external power source. The external rechargeable battery 70 includes a connection port 72 for connecting a power supply cord between the battery 70 and the module and/or feeder cart. FIG. 8 illustrates connection of a power cord to the feeder cart and module 20. The external rechargeable battery 70 may further include a power switch 74 to activate and deactivate the battery power source.

Figure 7:
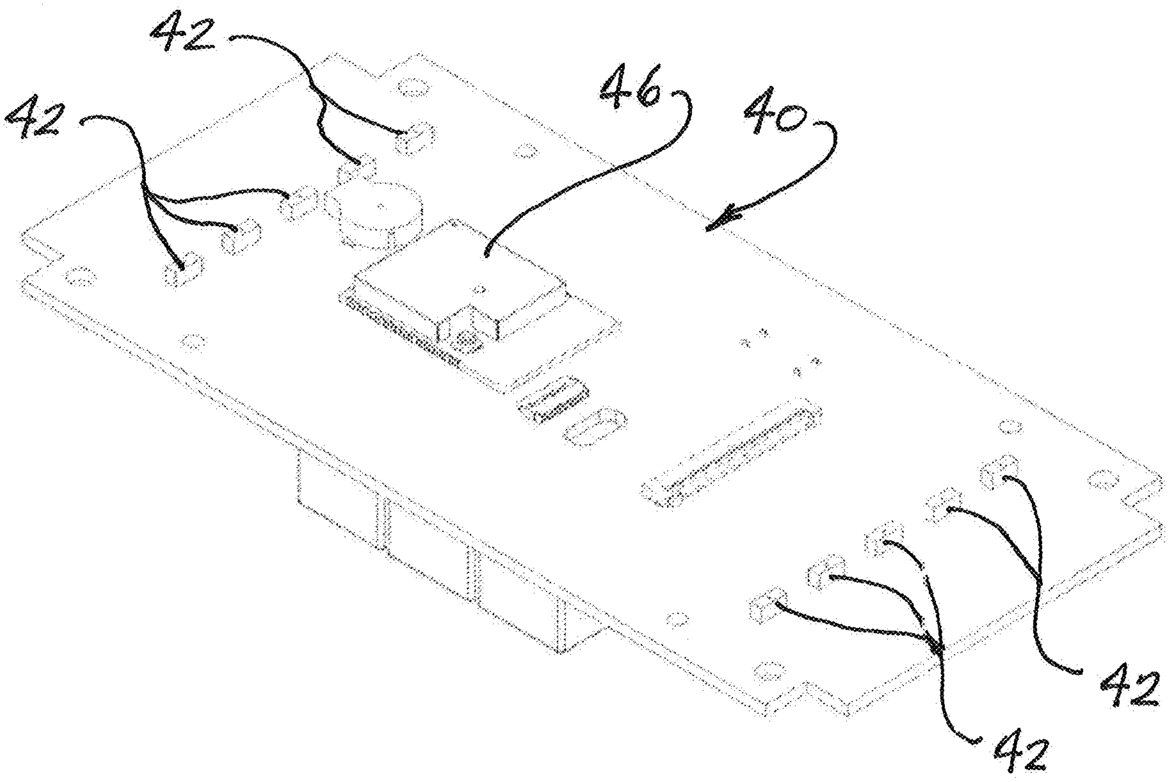
FIG. 7 is a perspective view showing the printed circuit board of FIG. 3 and including a microcontroller thereon.

FIG. 7 illustrates the printed circuit board further including a Wi-Fi enabled microprocessor 46 on the printed circuit board 40 to facilitate communication with a computer that runs software via wired or wireless protocols.

Since many modifications, variations and changes in detail can be made to the described embodiments of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. A feeder cart management system comprising:

at least one feeder cart configured to support a plurality of feeders holding component reels;

a scanning device configured to read identification information associated with component reels loaded on the feeder cart;

a plurality of LED assemblies on the at least one feeder cart for enhancing visibility of the at least one feeder cart;

at least one light pipe for transmitting light emitted from the plurality of LED assemblies;

a controller configured to receive production setup data corresponding to a product to be assembled on a surface mount assembly line;

the controller further configured to:

compare identification information of the component reels with the production setup data; and determine whether the feeder cart is correctly configured for the product; and a user interface configured to provide feedback indicating whether the feeder cart configuration matches the production setup data.

2. A feeder cart management system comprising:

a storage system configured to store a plurality of electronic component reels;

a production control system storing setup data associated with a product to be assembled;

at least one feeder cart configured to transport component feeders containing electronic component reels to a surface mount production line;

a scanning device configured to read identification information associated with the electronic component reels; and a controller configured to:

identify component reels required for the product using the production setup data;

verify that the required component reels are loaded onto the feeder cart using the scanning device; and generate feedback indicating whether the feeder cart is correctly configured for the product.

3. A method of managing a feeder cart system comprising:

receiving production setup data for a product build;

identifying component reels required for the product build;

loading the identified component reels onto a feeder cart;

scanning identification information associated with each of the loaded component reels;

comparing the scanned information with the production setup data; and confirming that the feeder cart is correctly configured for the product build.

* * * * *